(12) United States Patent
Baur et al.

(10) Patent No.: US 6,591,217 B1
(45) Date of Patent: Jul. 8, 2003

(54) METHOD AND DEVICE FOR DETECTING ERRORS IN THE SIGNALS OF A SYSTEM FOR MONITORING THE ROTATION OF A SHAFT

(75) Inventors: Jürgen Baur, Waldstetten (DE); Richard Veil, Stuttgart (DE)

(73) Assignee: Pilz GmbH & Co., Ostfildern (DE)

( * ) Notice: Subject to any disclaimer, the term of this patent is extended or adjusted under 35 U.S.C. 154(b) by 0 days.

(21) Appl. No.: 10/067,118

(22) Filed: Feb. 4, 2002

Related U.S. Application Data

(63) Continuation of application No. PCT/EP00/06394, filed on Jul. 6, 2000.

(30) Foreign Application Priority Data

Aug. 10, 1999 (DE) ......................................... 199 37 737

(51) Int. Cl.[7] ............................................. G06F 15/00
(52) U.S. Cl. ..................................................... 702/145
(58) Field of Search ..................... 702/145; 324/207.16, 324/207.19

(56) References Cited

U.S. PATENT DOCUMENTS

| 5,216,626 A | 6/1993 | Kranitzky |
| 5,612,906 A | 3/1997 | Gotz |
| 5,796,357 A | 8/1998 | Kushihara |
| 5,977,752 A | 11/1999 | Schulz |

FOREIGN PATENT DOCUMENTS

| DE | 20 20 393 | 11/1971 |
| DE | 37 42 357 A1 | 12/1987 |
| DE | 38 19 994 A1 | 12/1989 |
| DE | 39 32 187 A1 | 1/1991 |
| DE | 43 36 767 A1 | 10/1993 |
| DE | 43 31 151 A1 | 3/1995 |
| DE | 195 20 299 A1 | 12/1996 |
| EP | 0 408 799 A1 | 1/1991 |
| EP | 0 601 214 A1 | 6/1994 |
| EP | 0 748 054 A2 | 12/1996 |
| GB | 2 200 217 A | 7/1988 |
| WO | WO 96 30861 A1 | 10/1996 |

OTHER PUBLICATIONS

Patent Abstracts of Japan, vol. 014, No. 358 (P–1087), Aug. 2, 1990 and JP 02–130421 A (Omron Tateisi Electron Co.), May 18, 1990—Abstract.
Resolver RTD 1 A 4, Technische Anderungenvorbehalten, Jul. 1997.
Analog Devices—Low Cost, Complete 12–Bit Resolver–to–Digital Converter, AD2S90, Analog Devices, Inc., Norwood, Massachusetts, U.S.A., 1999.
Analog Devices—Variable Resolution, Monolithic Resolver–to–Digital Converter, AD2S80A, Analog Devices, Inc., Norwood, Massachusetts, U.S.A.
Operating instructions from Pilz GmbH for a standstill monitoring relay called PDZ.

*Primary Examiner*—Kamini Shah
(74) *Attorney, Agent, or Firm*—Cohen, Pontani, Lieberman & Pavane

(57) ABSTRACT

The present invention relates to a device and a method for safely monitoring the rotary motion of a shaft. The device comprises measuring means for recording a first and a second signal, wherein the first signal represents the motion characteristic of an angular position of a first reference point of the shaft and the second signal represents the motion characteristic of an angular position of a second reference point of the shaft. The first and the second reference points are displaced one relative to the other by a rotary angle of the shaft. Further, the device comprises evaluator having a comparator by means of which instantaneous values of the first and the second signals can be compared one with the other using a predefined geometric relation.

20 Claims, 6 Drawing Sheets

METHOD AND DEVICE FOR DETECTING ERRORS IN THE SIGNALS OF A SYSTEM FOR MONITORING THE ROTATION OF A SHAFT

CROSS-REFERENCES TO RELATED APPLICATIONS

This application is a continuation of copending international patent application PCT/EP00/06394 filed on Jul. 6, 2000 and designating the U.S., which claims priority of German patent application DE 199 37 737.5 filed on Aug. 10, 1999.

BACKGROUND OF THE INVENTION

The present invention relates to a method and a device for safely monitoring the rotary motion of a shaft. The device comprises measuring means for recording a first and a second signal, wherein the first signal represents the motion characteristic of an angular position of a first reference point of said shaft and the second signal represents the motion characteristic of an angular position of a second reference point of said shaft, wherein said first and said second reference points are spaced apart one from the other by a rotary angle of said shaft, and wherein said device further comprises an evaluator which receives said first and said second signals.

An example of a rotary motion sensor that supplies such before-mentioned signals is, for instance, a resolver. Resolvers are well known in the art for recording rotary motions. They comprise a rotary transformer, the rotor of which is connected to the shaft which is to be monitored, and the stator of which comprises two separate windings arranged on the outer circumference of the shaft with an angular displacement of 90° one relative to the other. Being coupled in transformer fashion, the two stator windings are fed with a signal that is supplied via the rotor winding. The signals present at the output of the stator windings then represent the before-mentioned first and second signals. The function of a resolver will be described hereafter in more detail with reference to FIGS. 2 and 3.

For evaluation of resolver signals, complete circuits are known and available as integrated circuits (IC), as for example the integrated circuit No. AD2S80A available from Analog Devices. That IC is a so-called resolver/digital converter which calculates the rotary angle of the shaft from the resolver signals and presents the result as a digital numeric word at its outputs. In addition, a signal proportional to the rotary speed of the shaft is presented at an other output. Thereby, the known module generally allows to monitor the rotary speed of a shaft. However, this monitoring is not safe, since, for instance, a short circuit between two windings occurring in one of the stator windings cannot be detected reliably. Likewise, internal functional errors occurring in the integrated circuits cannot be safely detected, either. It is therefore possible, for example, that the integrated circuit fails due to some errors, thereby supplying a signal that indicates the shaft to be monitored at a standstill, although the shaft actually rotates at high speed.

Failsafe monitoring of rotary motions of shafts is necessary, for example, when the rotating shaft presents a risk for machine personnel or other machine elements. This is especially the case in situations where an operator has to work within the danger zone of a rotating shaft during set-up operations. The evaluation circuits for resolver signals known heretofore are not suited for safely monitoring the rotary motion of a shaft.

In order to ensure safe monitoring in such a case, it is known to arrange at least one additional rotation sensor at the shaft, in addition to the resolver. Usually, even two separate rotation sensors, for example incremental pickups, are employed today. In general, these additional rotation sensors merely serve to ensure safe monitoring of the rotary motion of the shaft. In addition, a resolver is frequently used as a third sensor for adjusting the rotary motion of the shaft during normal operation. An example of such a known arrangement will be explained hereafter with reference to FIG. 1. As an evaluation device for safely monitoring of zero-speed conditions, or for safely monitoring a controlled low rotary speed of the shaft, a standstill monitoring relay called PDZ available from Pilz GmbH & Co., Ostfildern, Germany, may be used, for example; this monitoring relay is described in the company's Operating Instructions No. 19 161.

Another example of a device for safely monitoring a speed is described in DE-A-38 19 994. Said known device uses two separate inductive proximity pickups as sensors.

Using a plurality of additional sensors for safely monitoring the rotary motion of a shaft is expensive and negatively affects the costs of an installation to be monitored.

SUMMARY OF THE INVENTION

It is an object of the invention to provide a device and a method of the before-mentioned kind which allow the rotary motion of the shaft to be safely monitored, even with only a single rotation sensor, especially a singly resolver.

It is another object of the invention to provide an arrangement having a rotating shaft, the rotation of which is controlled by a drive control, and a safety device for monitoring the rotation of the shaft, wherein said safety device is capable of safely stopping the rotational movement of the shaft, when an error is detected.

According to one embodiment, these and other objects are achieved by a device of the before-mentioned kind, wherein the evaluator comprises a comparator which is capable of comparing instantaneous values of the first and the second signals using a predefined geometric relation.

According to another embodiment, these objects are further achieved by a method of the before-mentioned kind, wherein instantaneous values of the first and the second signals are compared using a predetermined geometric relation.

According to the invention, instantaneous values of the first and the second signals are compared one with the other. Due to the fact that the signals are recorded at different reference points of the same shaft, there is a predetermined relation between such signals. As long as the operation of the monitoring device is free from errors, a comparison taking said relationship into account must always lead to a predictable result. Whenever a comparison between the two signals yields a different result than would be expected, an error has occurred in the monitoring device.

In this connection, the term "geometric relation" is understood as generally describing the predetermined relation between the instantaneous values of the two signals, which can be determined based on the geometric position of the reference points one relative to the other. This relationship may be graphically illustrated as a locus curve in a plane whose coordinates are defined by the instantaneous values of the two signals. If the actual shape of the locus curve derived from the recorded instantaneous values deviates from the expected shape of the locus curve, an error has occurred in the monitoring device.

It should be noted that, in principle, the method according to the invention can be employed for safe monitoring also when a plurality of separate sensors are used for recording the first and second signals. However, this is not required, since the method can be used with a single resolver for recording the rotary motion, because the described first and second signals are supplied by the resolver as such. Any possible error, as for example a short circuit between windings in one of the stator windings of the resolver, or failure of a component of the evaluator that will be described in more details in the following, any such possible error leads to a different result in the comparison between the instantaneous values as that one would have expected due to the predetermined relation between the two signals. Consequently, the method according to the invention can be employed for safely monitoring the rotary motion of a shaft with a single rotation sensor only, namely a resolver. The additional use of further sensors, such as incremental pickups, as usual heretofore, is no longer necessary.

According to a preferred embodiment of the invention, the comparator is capable of comparing concurrent instantaneous values of the first and the second signals.

This feature advantageously simplifies the predetermined relation between the instantaneous values of the first and the second signals so that the comparison between the instantaneous values can be realized more easily. This consequently reduces the effort required for both the development and the production of the inventive device. The corresponding method can be carried out more quickly in this way.

According to a further embodiment of the invention, the first and the second reference points are spaced apart one from the other by a rotary angle of 90°.

This feature likewise simplifies the predetermined relation between the instantaneous values of the two beforementioned signals. Consequently, the effort and the costs of the device are likewise reduced by this feature. The corresponding method can be carried out more easily and more quickly.

According to another embodiment of the invention, the signal paths for recording the first and the second signals are identical under signal-processing aspects.

Identical under signal-processing aspects means that identical output signals will be achieved, whenever identical input signals are fed into the respective signal paths. Of course, however, the signal paths may be implemented using differing components, for example from different manufacturers. The only requirement that has to be fulfilled is that the first and the second signals must be influenced in identical fashion. The feature also contributes toward making the comparison between the two signals easier and quicker. In combination with the feature described before, this embodiment of the invention results in the geometric relation being a circular function which can be evaluated in a very easy manner both analytically and arithmetically, as will be shown hereafter.

According to a further embodiment of the invention, the measuring means comprise a resolver whose stator signals are the first and the second signals.

This feature takes up the advantage already mentioned before, namely a single sensor is required only for safely monitoring the rotary motion of the shaft, when a resolver is employed. Accordingly, an especially simple and low-cost structure is achieved by this embodiment of the invention. However, it should be stressed once more that, in principle, the method may also be carried out with the aid of separate sensors for recording the first and the second signals. In addition, other sine/cosine signal pickups may be used instead of a resolver for carrying out the method according to the invention. Compared with such pickups, however, a resolver provides the advantage of being extremely robust so that it offers high error resistance from the very beginning. In addition, resolvers are already in use in many systems as sensors for the drive control or drive governing systems. Thus, the use of the resolver signals, which are available anyway, allows further cost savings in the implementation of the inventive device.

In a further embodiment of the invention, the comparator comprises a digital calculating unit in which the geometric relation is stored as a calculating rule using the instantaneous values as inputs.

A digital calculating unit of that kind is particularly a digital signal processor. Such a processor is especially optimized for carrying out computing operations. Since the predetermined relation between the instantaneous values of the first and the second signals can be described, generally, by a mathematical formula, the comparison between the instantaneous values can be carried out with particular accuracy with the aid of such a processor or, to say it more generally, with the aid of a digital calculating unit. If the geometric relation is a circular function, the sum of the squares of the instantaneous values of the first and the second signals must always yield a constant value as long as no error occurres in the monitoring device. Using a digital calculating unit, especially in the form of a digital signal processor, it is possible to detect even very small deviations of the instantaneous values of the first and the second signals from their desired values.

According to an alternative embodiment of the feature described above, the comparator comprises a memory in which admissible combinations of instantaneous values corresponding to the geometric relation are stored in such a way that any incorrect combinations of recorded instantaneous values can be detected.

This feature may be implemented, for example, by storing the correct and therefore admissible combinations of instantaneous values of the two signals in an allocation table. If a combination of recorded instantaneous values is not contained in that table, it is automatically detected as an incorrect combination, and a corresponding error signal can be generated. This feature provides the advantage that it can be implemented in a very simple and especially low-cost manner. in particular, the costs of a relatively expensive digital signal processor can be avoided in this way. An additional advantage of that feature is the fact that the evaluation process can be carried out very quickly, when the number of admissible combinations of instantaneous values stored is not too high.

According to a preferred embodiment of the feature described before, the stored combinations of instantaneous values define two-dimensional admissible interval fields each of which adjoins neighboring admissible interval fields.

In more concrete terms, this means that the stored combinations of admissible instantaneous values define interval areas, and the locus curve of the recorded instantaneous values stays within said interval areas as long as the device operates without any error. If any of the locus points defined by two recorded instantaneous values comes to lie outside the admissible interval fields, this is an indication of an error occurred in the monitoring device. The term "adjoining" is to be understood here to also include overlapping of neighboring interval fields in the bordering area. The feature mentioned above advantageously permits the shape of the plotted locus curve to be continuously monitored.

An especially advantageous solution is achieved if a maximum of two interval fields adjoin one another at each point of the specified locus curve. In this case, the two-dimensional interval fields are defined relative to the expected shape of the locus curve, such that each locus point of the locus curve may come to lie in the boundary area of two interval fields at maximum. A boundary point, where three or even more interval fields adjoin each other, is avoided in this case. This feature provides the advantage that any combination of recorded instantaneous values may cause an ambiguity with respect to two admissible interval field at maximum, but there will never be an ambiguity with respect to three or more admissible interval fields. The effort and, consequently, the time required for carrying out the comparison are reduced therewith.

According to a further embodiment of the invention, the device comprises means for determining at least the rotary speed of the shaft.

In addition to that, the before-mentioned means may also be capable of determining the respective angular position of the shaft and/or its sense of rotation. Such determination may be effected with the aid of methods known per se, based on the evaluation of the first and the second signals. This feature advantageously enables an additional error check based on the values so determined, namely by comparison of these values with corresponding values provided by a separate speed control unit. Alternatively, this feature may contribute to avoid the requirement of an additional speed control unit.

According to still another embodiment of the invention, each of the measuring means for the first and the second signals has a separate and independent recording channel.

This feature is advantageous, since the signal paths for the two before-mentioned signals are completely separated one from the other with the result that the failsafety of the device is even further improved. It is particularly preferred in this connection if the two separate recording channels have a diversity-based structure, i.e. they use different components. In this case, the probability that the recorded instantaneous values of the first and the second signals might be erroneously varied in the same way and at the same time is even further reduced.

According to a further embodiment of the invention, the device comprises two comparators, one redundant to the other, whose comparison results are supplied to a monitoring unit.

This feature further improves the failsafety of the device, because it allows a failure occurring within one of the comparators reliably to be detected. According to an especially preferred solution, the two mutually redundant comparators have a diversity-based structure. More preferably, the monitoring unit likewise has a two-channel structure, wherein each of the two channels is assigned to one of the two mutually redundant comparators.

According to another embodiment of the invention, the device is designed as a modular add-on unit for an additional rotary-motion evaluation device.

This feature provides the advantage that the inventive device can be retrofitted in a simple and low-cost manner even in existing installations. In addition, the inventive device can be used in establishing new installations in combination with identical and/or other rotation pickup devices, especially with standard components. This permits the inventive device to be employed in a generally low-cost manner.

It is understood that the features recited above and those yet to be explained below can be used not only in the respective combination indicated, but also in other combinations or in isolation, without leaving the context of the present invention.

BRIEF DESCRIPTION OF THE DRAWINGS

Exemplary embodiments of the invention are shown in the drawings and are explained in more detail in the description which follows. In the drawings.

DETAILED DESCRIPTION OF PREFERRED EMBODIMENTS

Figure 1:
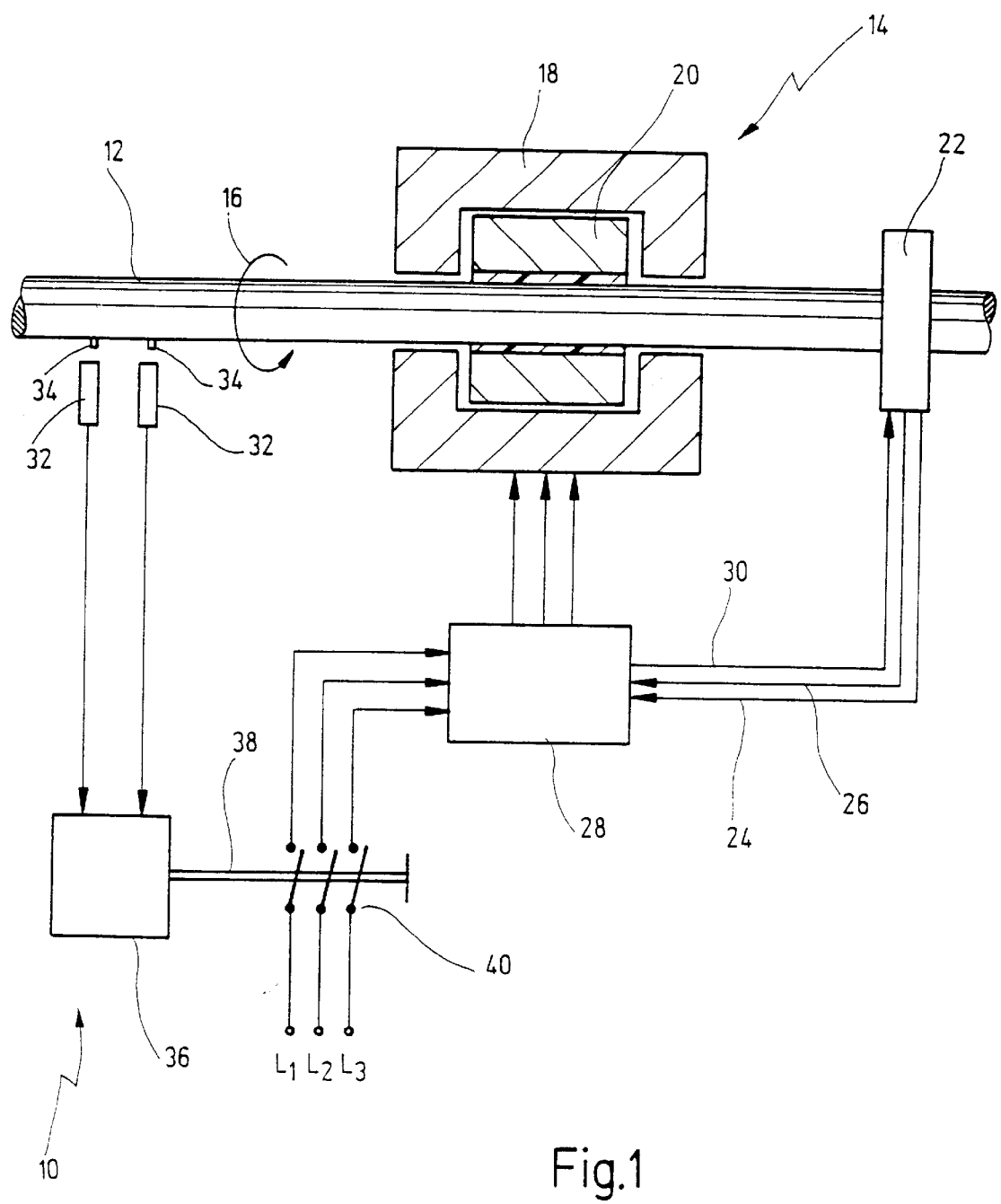
FIG. 1 shows a device for safely monitoring the rotary motion of a shaft according to the prior art.

In FIG. 1 a device according to the invention for safely monitoring the rotary motion of a shaft is generally indicated by reference numeral 10.

A shaft 12 to be monitored is driven by a motor 14 in the direction indicated by arrow 16. The motor 14 is shown, by way of example, as an AC motor, the stator 18 and the rotor 20 being schematically indicated only in the drawing.

Figure 2:
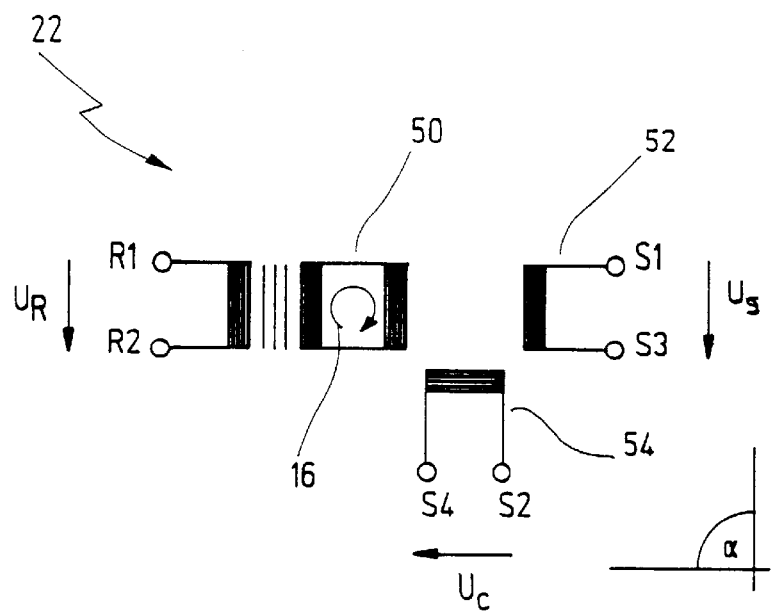
FIG. 2 shows a functional diagram of a resolver.
Figure 3:
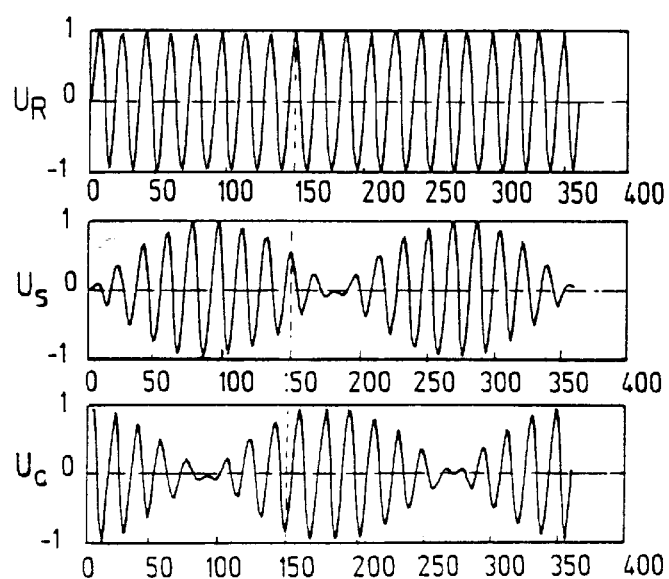
FIG. 3 shows the input and the output signals of the resolver of FIG. 2.

Reference numeral 22 designates a resolver whose function will be described hereafter in more detail with reference to FIGS. 2 and 3. The stator signals 24 and 26 of the resolver 22 are supplied to a drive control 28. In the reverse direction, the drive control 28 supplies the rotor signal 30 to the rotor of the resolver 22.

Reference numeral 32 designates two additional pickups, which are independent one from the other and which record the movement of cams 34 arranged on the shaft 12. The output signals of the two incremental pickups 32 are supplied to a safe evaluation unit 36 that monitors, in a manner known per se, the shaft 12 for zero-speed situations and limited rotary motion. The evaluation unit 36 comprises a triggering element 38 which in turn acts on switches 40 by means of which the power supplied to the drive control 28 and/or the motor 14 can be interrupted. When the safe evaluation device 36 detects a error or an inadmissibly high speed of the shaft 12, the driving force of shaft 12 is immediately cut off.

The device 10, as described herein, is known from its use for monitoring the rotary motion of a shaft 12. However, it suffers from the disadvantages described at the outset with respect to the effort and costs resulting from the plurality of sensors in use, i.e. the resolver 22 and the incremental pickups 32 in the present case.

In the following description of the remaining figures, same reference numerals are used to designate elements identical to those that have been described above with reference to FIG. 1.

In order to provide a complete description of the invention, the structure and the function of the resolver 22, which is known per se, will be explained once more with reference to the functional diagram shown in FIG. 2, and the resolver signals illustrated in FIG. 3. The resolver 22 comprises a rotor 50 fixed on the shaft 12. Consequently, the rotor 50 follows the rotary motion of the shaft 12. The rotor 50 comprises two electrically connected coil windings one of which has its output end coupled, in transformer fashion, to two stator windings 52, 54 of a stator arranged concentrically relative to the rotor. The other one of the two rotor windings serves to supply the rotor, likewise in transformer fashion, with the rotor signal 30 designated by $U_R$ in FIG. 3. As a rule, the stator windings 52, 54 of resolver 22 are staggered one relative to the other by a rotary angle $\alpha$ of 90°. This causes the stator signals 24, 26 of the resolver 22 to be amplitude-modulated with different phases, as illustrated for the two signals $U_s$ and $U_c$ in FIG. 3. The envelops of the two stator signals $U_s$ and $U_c$, respectively, are sine or cosine-shaped, respectively. From the two stator signals $U_s$ and $U_c$ it is possible, in a manner known per se, to determine the rotary angle of the shaft 12 and, using the rotor signal $U_R$, also to determine the sense of rotation of the shaft 12.

Figure 4:
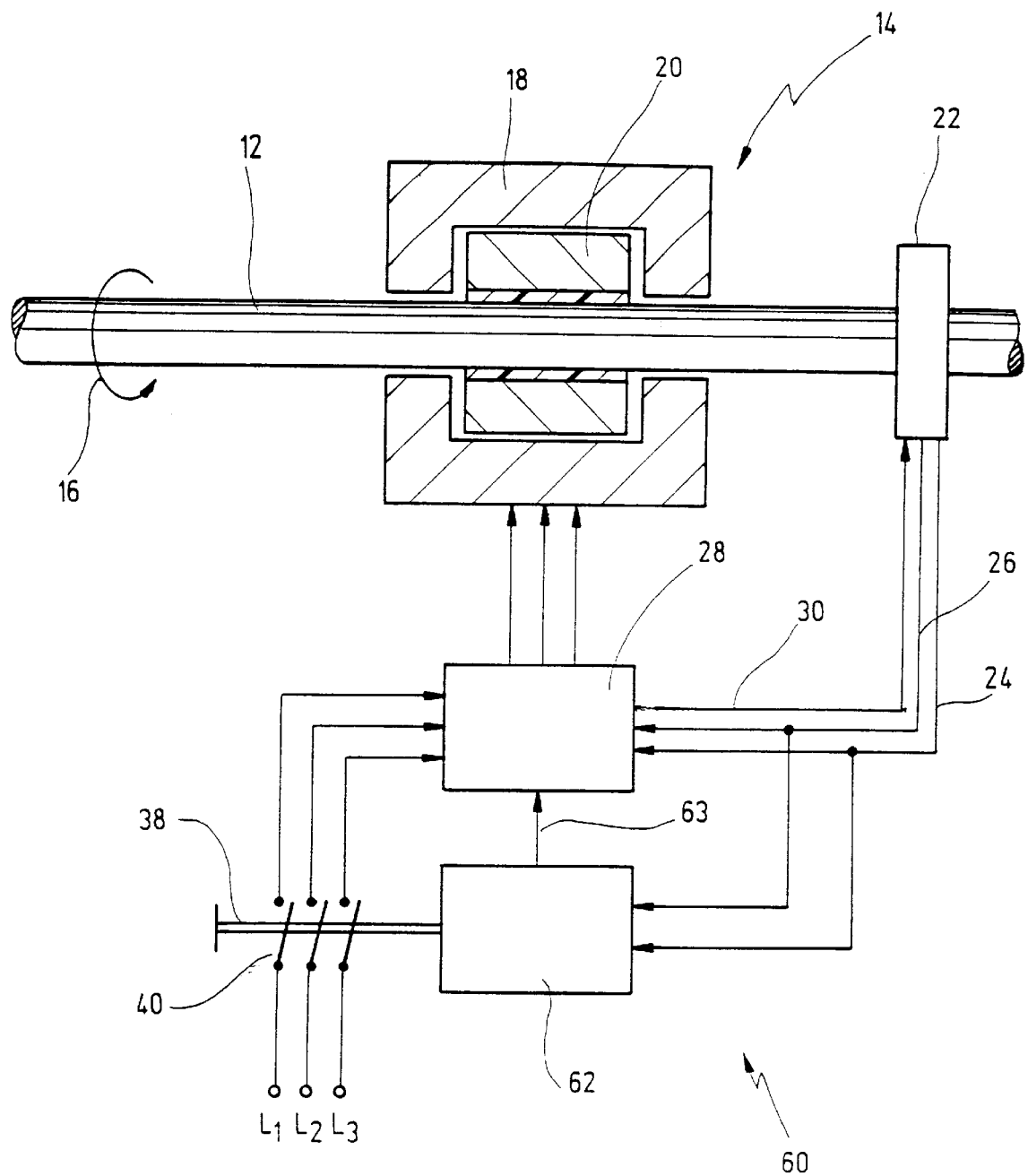
FIG. 4 shows a preferred embodiment of the invention.

In FIG. 4 an embodiment of the device according to the invention is generally designated by reference numeral 60.

The device 60 differs from the device 10 according to FIG. 1 substantially by the failsafe evaluation unit 62 which is supplied, in parallel to the drive control 28, with the stator signals 24, 26 of the resolver 22. As an optional feature, the evaluation unit 62 may be supplied also with the rotor signal 30 of the resolver 22 which enables the evaluation unit 62, at least generally, to determine all motion parameters of the rotary motion, in addition to monitoring the rotary motion of the shaft 12. As a rule, however, the comparison of the two stator signals 24, 26 described hereafter is sufficient for monitoring purposes, and for determining the presence of any safety-critical rotary motion.

As a preferred embodiment, it is a further characteristic of device 60 that the evaluation unit 62 is in a position to cut off the drive control 28 via a second cut-off path 63, namely by blocking the release signal of the drive control 28 via this second cut-off path.

Figure 5:
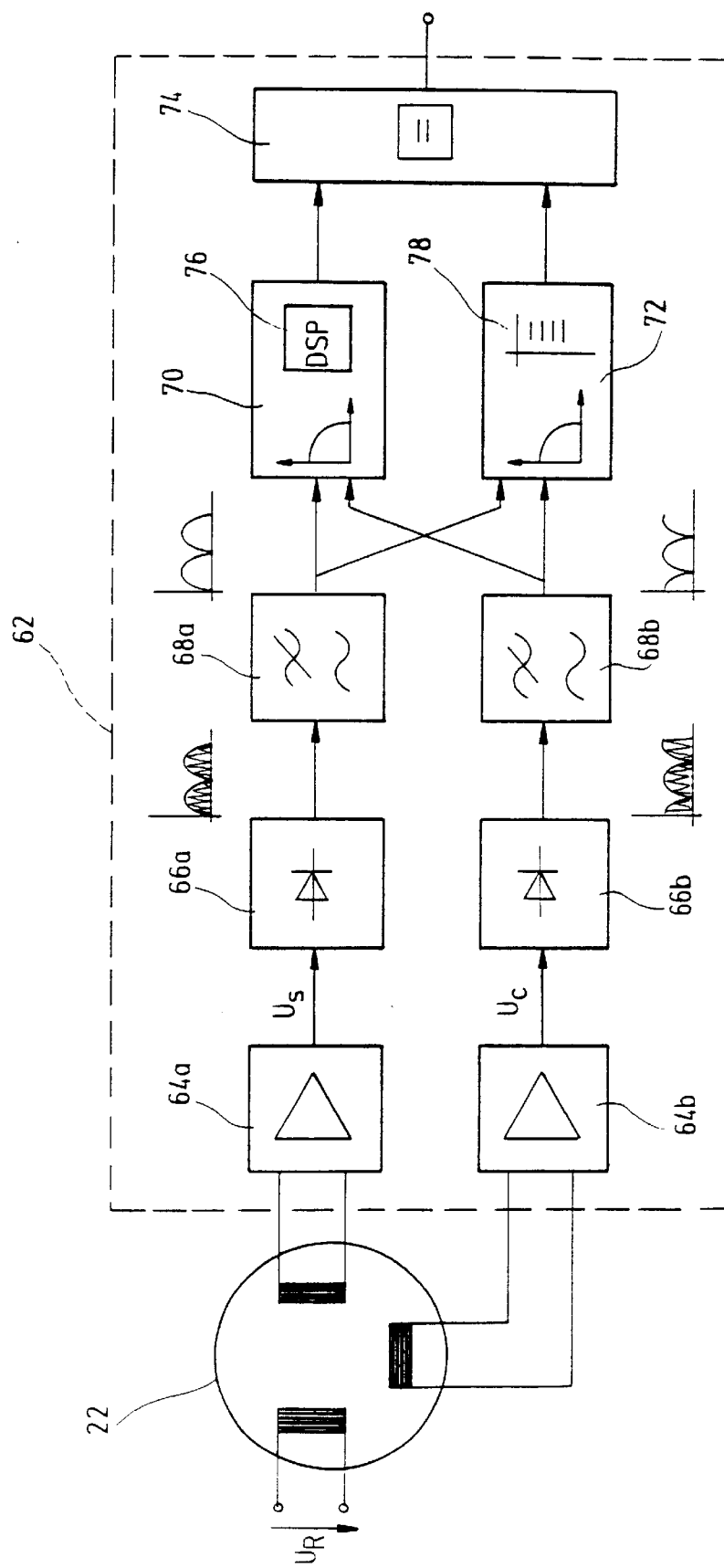
FIG. 5 shows a block diagram of the measuring and evaluator of the embodiment illustrated in FIG. 4.

The essential functional components of the evaluation device 62 according to FIG. 4 are illustrated in the block diagram of FIG. 5. The evaluation device 62 has a two-channel structure throughout, i.e. the stator signals 24, 26 of the resolver 22 ($U_s$, $U_c$) are processed in separate, independent signal channels. The signal channels are diversity-based in structure, i.e. they are built up from partly different components, although this is not absolutely necessary for the implementation of the method according to the invention.

The input module of the evaluation device 62 is formed in each channel by a differential amplifier 64a, 64b, that carries out an impedance conversion and level adaptation step on the stator signals 24, 26 supplied from the resolver 22. At the output of the differential amplifiers 64a, 64b, the stator signals $U_s$, $U_c$ are present in the form illustrated in FIG. 3. These signals are then supplied, in each of the two channels, to a rectifier circuit 66a, 66b. The rectifier circuits 66a, 66b, in combination with the subsequent low-pass circuits 68a, 68b, then perform an amplitude demodulation step known per se on the stator signals 24, 26. The intermediate signals obtained in this way are indicated diagrammatically for each of the two channels at the outputs of the respective modules.

The rectified sine-wave and cosine-wave envelop signals of the stator signals 24, 26, respectively, are present at the outputs of the low-pass circuits 68a, 68b. These signals are supplied to comparators 70, 72, respectively, which compare the instantaneous values of the processed stator signals 24, 26 according to the invention.

In contrast to the illustration of FIG. 5, one of the two comparators 70, 72 is, in principle, sufficient for carrying out the method according to the invention. However, by employing two separate comparators 70, 72, two-channel processing is continued insofar as the comparison results achieved from the two comparators 70, 72 can be mutually checked once more in a subsequent monitoring unit 74. This permits even errors to be detected that may occur within the comparators 70, 72. If one of the comparators 70, 72 should yield an incorrect result, the output signal of the monitoring unit 74 will cause the triggering element 38 to cut off the drive of the shaft 12. In addition, the release signal of the drive control 28 will be blocked via the second cut-off path 63.

In the embodiment presently described, the two comparators 70, 72 are differently designed, and each works according to one of the two methods that will be described hereafter. It is thereby possible to achieve an especially high degree of failsafety. On the other hand, however, it is also possible to implement the two comparators 70, 72 on the basis of only one of the two methods, which will be described hereafter, or even on the basis of a modification of such methods. For purposes of the description that follows it will be assumed that the comparator 70 comprises a digital processing unit in the form of a digital signal processor 76, whereas the comparator 72 substantially comprises a memory 78 in which admissible combinations of instantaneous values of the stator signals 24, 26 are stored. The instantaneous values of the stator signals 24, 26 are stored in such a way as to define admissible interval fields in which the locus curve derived from the two stator signals 24, 26 must stay during correct operation of the device.

Figure 6:
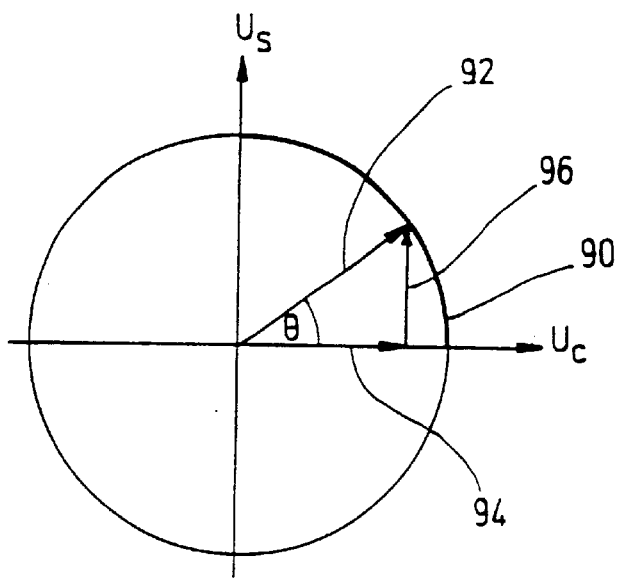
FIG. 6 shows the geometric relation by means of which the measured instantaneous values of the first and the second signals are compared in the embodiment illustrated in FIG. 4.

The basic idea underlying the inventive method will be understood from FIG. 6 at best. This Figure shows a two-dimensional coordinate system, the two axes of which are each assigned to one of the two stator signals $U_s$, $U_c$. The coordinate system thus defines the $U_s$-$U_c$ plane in which combinations of instantaneous values of the two stator signals define locus points. During correct operation of the monitoring system 60, all possible locus points lie on a quarter-circle locus curve 90. The locus curve 90 describes the path of the terminal point of a pointer 92, which extends from the origin of the coordinate system and the length and direction of which are determined by the instantaneous values of the stator signals. Reference numeral 94 indicates, by way of example, the cosine component of the pointer 92, while reference numeral 96 represents the sine component of the pointer 92.

As mentioned before, the terminal point of pointer 92 always moves along the quarter-circle locus curve 90 as long as the evaluation device 62 operates correctly. Thus, by comparing the instantaneous values of the stator signals with respect to whether or not this condition is met, it is possible to draw a conclusion regarding the correct operation of the device 60.

According to a first embodiment of the invention, illustrated in FIG. 5 by way of comparator 70, the geometric relation defining the quarter-circle locus curve 90 is calculated by means of digital signal processor 76 using the recorded instantaneous values of the stator signals 24, 26. The formula for this calculations reads:

$U_s^2 + U_c^2 =$ constant.

This means that the square of two instantaneous values, picked up at the same time, must always equal the same constant value. The exact value of the sum depends on the actual parameters of the processing channels of the evaluation device 62. Whether or not the before-mentioned condition is fulfilled, can be exactly verified with the aid of a stored in the digital signal processor 76. The calculation rule links the recorded instantaneous values of the stator signals 24, 26 as input values. This procedure of comparing the recorded instantaneous values based on the locus curve 90 will be referred to hereafter as arithmetic signal evaluation.

Using the formula:

$$\theta = \arctan \frac{U_s}{U_c}$$

it is moreover possible to determine the current rotary angle of the shaft 12. If the variation of that rotary angle is determined over a time interval T, it is additionally possible to calculate the angular speed and, thus, the speed of the shaft 12. All these operations can be stored in the digital signal processor 76 in the form of a calculating rule with corresponding input values.

In contrast, the comparator 72 implements a different method which will be described hereafter as analytic signal evaluation method. The basic idea underlying that embodiment will now be explained with reference to FIG. 7.

Figure 7:
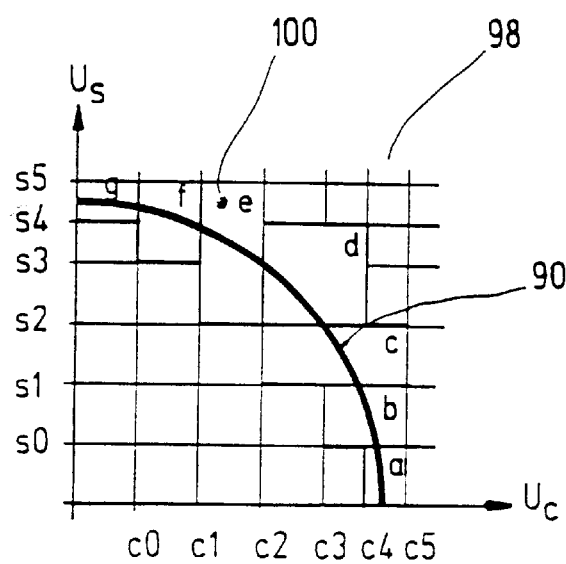
FIG. 7 shows a definition of admissible interval fields, by means of which the measured instantaneous values of the first and the second signals are compared in the embodiment illustrated in FIG. 4.

In FIG. 7, a grid 98 formed by dividing the $U_c$ axis and the $U_s$ axis, respectively, is placed under the $U_s$-$U_c$ plane with locus curve 90. Admissible interval fields, designated by letters a to g, are indicated in the grid 98. The admissible interval fields define the area in which the locus curve 90 has to stay during correct operation of the device 60. As can be seen, the size and position of the interval fields a to g have been selected in such a way that the points of the locus curve 90 can come to lie in the border area of two adjoining interval fields at maximum, but never in the border area of three or more adjoining interval fields.

In the case of the comparator 72, the limits of the interval fields are defined by twelve-digit binary code words whose first six digits correspond to the grid lines s0 to s5 while its second six digits correspond to the grid lines c0 to c5. Thus, the interval field d is determined, for example, by the digital word 00x111.00x111, wherein "x" means that the digit in this position may optionally be a 0 or a 1 ("Don't care").

For being compared, the demodulated stator signals 24, 26 are initially digitized in the comparator 72 in a data format that corresponds to the stored code of the admissible interval fields a to g. Thereafter, it is verified in the memory 78 of the comparator 72 whether or not the data value obtained in this way corresponds to the code word of an admissible interval field. If this is true, it follows that the corresponding instantaneous values of the stator signals 24, 26 define a locus point that lies within the corresponding interval field. If, in contrast, digitization of the recorded instantaneous values does not result in a data value stored in the table of memory 78, it follows that the recorded instantaneous values define a locus point that lies outside from the admissible interval fields a to g. In this case, an error has occurred in the monitoring device 60.

All in all, the process of comparing the recorded instantaneous values of the stator signals 24, 26 in comparator 72 is a little less accurate than with comparator 70. A locus point 100 lying in the interval field e of the locus curve would, for example, be regarded as admissible so that the comparator 72 would not detect the occurrence of an error in the device 60 in this case. By selecting suitable interval limits, however, it is possible to minimize the tolerances within the combinations of instantaneous values may deviate from the geometrically exact locus curve 90.

With comparator 72 it is likewise possible to determine the speed of shaft 12 from the recorded instantaneous values of the stator signals 24, 26, by measuring the time between two successive interval field transitions using a counter not shown in the drawing.

Figure 8:
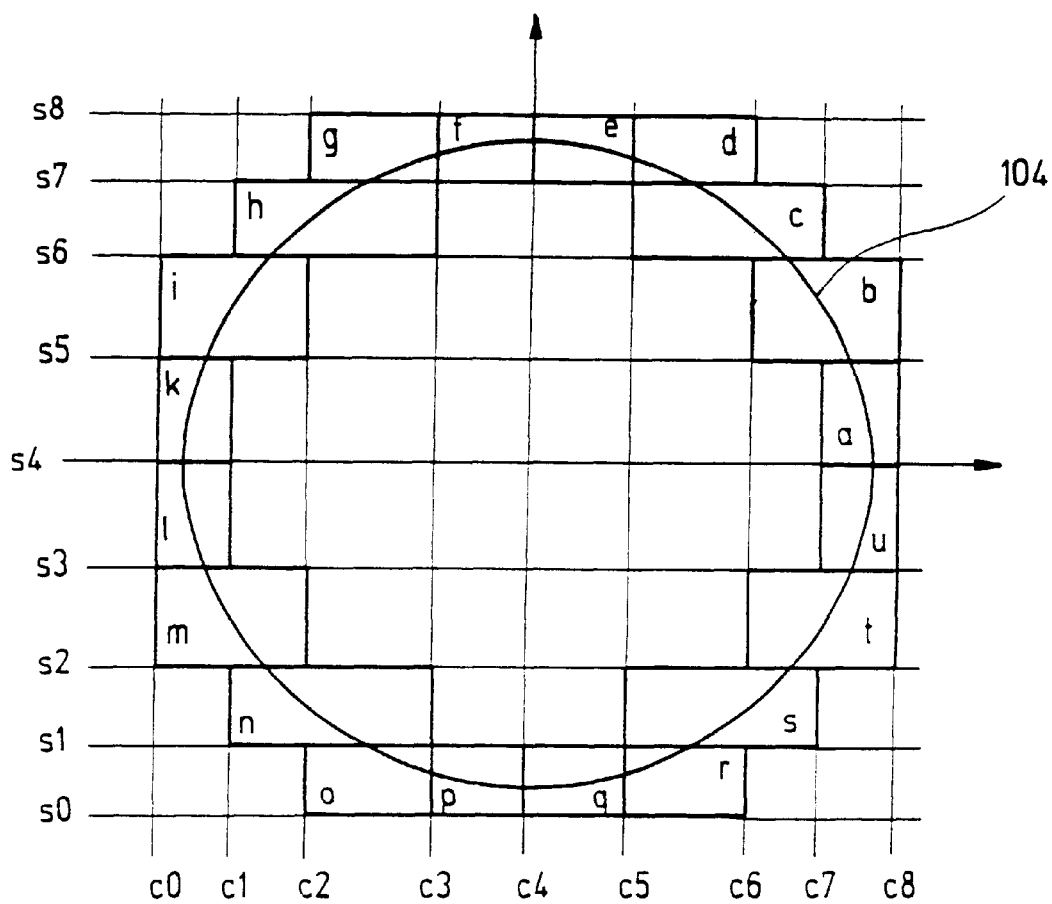
FIG. 8 shows another example of a definition of admissible interval fields for a situation where the geometric relation describes a full circle.

For an evaluation device 62, which is only intended to safely monitor a specific admissible speed of shaft 12, it will be sufficient to compare the instantaneous values of the recorded stator signals 24, 26 along the quarter-circle locus curve 90. However, when it is additionally desired to monitor the present angular position of shaft 12, or its sense of rotation, then the locus curve of the instantaneous values of the stator signals 24, 26 needs to be monitored along a full circle. FIG. 8 shows a possible definition of interval fields a to u in this regard, and the corresponding locus curve 104 has to stay in these interval fields for correct operation of the device 60. The process of comparing the recorded instantaneous values with respect to locus curve 104 is identical to the one described above.

Regardless of the implementation selected for comparing the recorded instantaneous values of the stator signals 24, 26, the evaluation device 62 is designed as a modular add-on unit in addition to a standard drive control 28 in case of the embodiment shown in FIG. 4. However, in a different embodiment not shown in the drawing the evaluation device 62 may be integrated in the drive control 28 of motor 14.

What is claimed is:

1. An arrangement for safely monitoring a rotary motion of a shaft, comprising:
   a shaft being capable of a rotary motion,
   a drive motor for rotating said shaft,
   a drive controller connected to said drive motor for controlling said rotary motion of said shaft, said drive controller receiving power from a power supply and a release signal,
   a measuring means being coupled to said shaft, said measuring means providing a first and a second signal, wherein said first signal includes first instantaneous values and a sine-shaped envelope, and wherein said second signal includes second instantaneous values and a cosine-shaped envelope, said first and second signals representing said rotary motion of said shaft, and
   an evaluator which receives said first and said second instantaneous values, said evaluator including a comparator which is capable of comparing said instantaneous values using a predefined geometric relation,
   wherein said evaluator is in the position to stop said rotary motion via a first and a second cut-off path, namely by interrupting said power from said power supply and by blocking said release signal.

2. The arrangement of claim 1, wherein said predefined geometric relation is a circular locus curve computed from said first and second instantaneous values.

3. The arrangement of claim 1, wherein said measuring means comprise a resolver having a rotor and a stator, said stator providing said first and said second signals.

4. The arrangement of claim 1, wherein said evaluator is designed as a modular add-on unit.

5. A device for safely monitoring a rotary motion of a shaft, said device comprising measuring means for recording a first and a second signal, wherein said first signal represents a motion characteristic of an angular position of a first reference point of said shaft and said second signal represents a motion characteristic of an angular position of a second reference point of said shaft, wherein said first and said second reference points are spaced apart one from the other by a rotary angle of said shaft, said device further comprising an evaluator which receives said first and said second signals, wherein said evaluator includes a comparator which is capable of comparing said first and second signals using a predefined geometric relation.

6. The device of claim 5, wherein said first and said second signals include concurrent first and second instantaneous values, and said comparator is capable of comparing said concurrent instantaneous values.

7. The device of claim 6, wherein said comparator includes a digital calculating unit, and said geometric relation is stored in said digital calculating unit as a calculating rule using said instantaneous values as inputs.

8. The device of claim 6, wherein said comparator includes a memory, and wherein correct combinations of said instantaneous values corresponding to said geometric relation are stored in said memory such that any incorrect combinations of said instantaneous values can be detected.

9. The device of claim 8, wherein said stored combinations define two-dimensional admissible interval fields, each of which adjoins at least one other admissible interval fields.

10. The device of claim 5, wherein said first and said second reference points are spaced apart one from another by a rotary angle of 90°.

11. The device of claim 5, further comprising a first and a second signal path for recording said first and said second signals, wherein said first and second signal paths are identical in view of signal-processing aspects.

12. The device of claim 5, wherein said measuring means comprise a resolver having a rotor and a stator, said stator providing said first and said second signals.

13. The device of claim 5, further comprising a speed calculator for determining at least a rotary speed of said shaft.

14. The device of claim 5, further comprising a monitoring unit and including at least two comparators each providing a comparison result, one redundant to the other, wherein said comparison results are both fed to said monitoring unit.

15. The device of claim 5, wherein said evaluator is designed as a modular add-on unit.

16. The device of claim 6, wherein said predefined geometric relation is a circular locus curve computed from said first and second instantaneous values.

17. A method for safely monitoring a rotary motion of a shaft, wherein a first and a second signal are recorded using measuring means, wherein said first signal represents a motion characteristic of an angular position of a first reference point of said shaft and said second signal represents a motion characteristic of an angular position of a second reference point of said shaft, wherein said first and said second reference points are spaced apart from another by a rotary angle of said shaft, and wherein said first and said second signals are evaluated in an evaluator, wherein said first and said second signals are compared using a predetermined geometric relation.

18. The method of claim 17, wherein said first and said second signals include concurrent first and second instantaneous values that are compared in said comparator.

19. The method of claim 18, wherein said predefined geometric relation is a circular locus curve computed from said first and second instantaneous values.

20. The method of claim 17, wherein said first and said second signals are recorded using a resolver.

* * * * *